United States Patent
Stainer

(10) Patent No.: US 9,799,384 B2
(45) Date of Patent: Oct. 24, 2017

(54) MULTI-BIT MRAM CELL AND METHOD FOR WRITING AND READING TO SUCH MRAM CELL

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

(*) Notice: Subject to any disclaimer, the term of this patent is extended or adjusted under 35 U.S.C. 154(b) by 0 days.

(21) Appl. No.: 15/309,229

(22) PCT Filed: Apr. 23, 2015

(86) PCT No.: PCT/EP2015/058797
§ 371 (c)(1),
(2) Date: Nov. 7, 2016

(87) PCT Pub. No.: WO2015/169610
PCT Pub. Date: Nov. 12, 2015

(65) Prior Publication Data
US 2017/0076771 A1  Mar. 16, 2017

(30) Foreign Application Priority Data
May 9, 2014  (EP) .................................... 14290144

(51) Int. Cl.
*G11C 11/00* (2006.01)
*G11C 11/16* (2006.01)
(Continued)

(52) U.S. Cl.
CPC ............ *G11C 11/161* (2013.01); *G11C 11/15* (2013.01); *G11C 11/1673* (2013.01);
(Continued)

(58) Field of Classification Search
CPC .......... G11C 11/16; G11C 11/15; H01L 43/08
(Continued)

(56) References Cited

U.S. PATENT DOCUMENTS 8,411,500 B2 * 4/2013 Gapihan ................ B82Y 25/00
365/158
2012/0201074 A1  8/2012 Berger et al.
2013/0070520 A1 * 3/2013 El Baraji .............. G11C 11/161
365/158

FOREIGN PATENT DOCUMENTS

EP        2447949 A1    5/2012
WO    2014063939 A1    5/2014

OTHER PUBLICATIONS

International Search Report for PCT/EP2015/058797 dated Apr. 23, 2015.
Written Opinion for PCT/EP2015/058797 dated Apr. 23, 2015.

* cited by examiner

*Primary Examiner* — Son Dinh
(74) *Attorney, Agent, or Firm* — Pearne & Gordon LLP

(57) ABSTRACT

A multi-bit magnetic random access memory (MRAM) cell including a magnetic tunnel junction including: a first magnetic storage layer, a second magnetic storage layer, a magnetic sense layer, a first spacer layer between the first magnetic storage layer and the magnetic sense layer, and a second spacer layer between the second magnetic storage layer and the sense layer. The first and second storage magnetization are switchable between m directions to store data corresponding to one of $m^2$ logic states, with m>2. The present disclosure further concerns a method for writing and reading to the MRAM cell and to memory devices including multi-bit MRAM cells.

18 Claims, 6 Drawing Sheets

(51) Int. Cl.
*G11C 11/15* (2006.01)
*G11C 11/56* (2006.01)
(52) U.S. Cl.
CPC ...... *G11C 11/1675* (2013.01); *G11C 11/1693* (2013.01); *G11C 11/5607* (2013.01)
(58) Field of Classification Search
USPC ........................................ 365/158, 171, 173
See application file for complete search history.

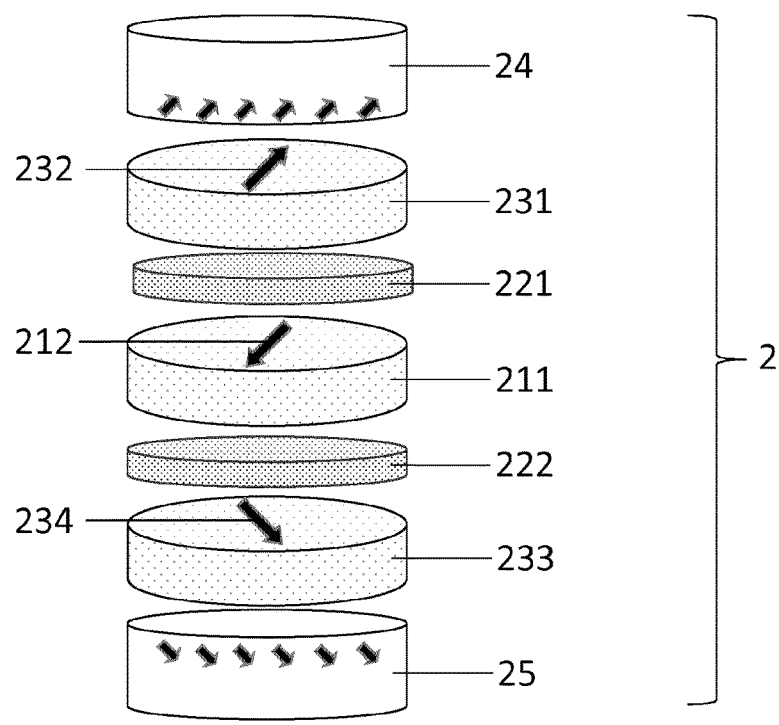
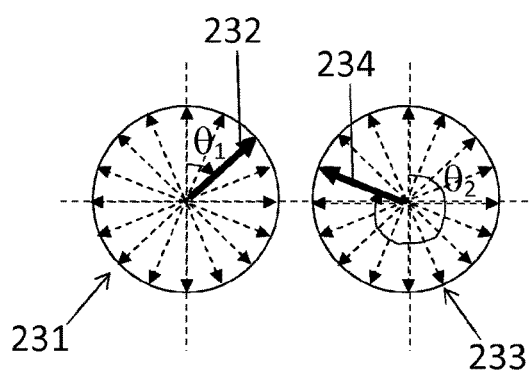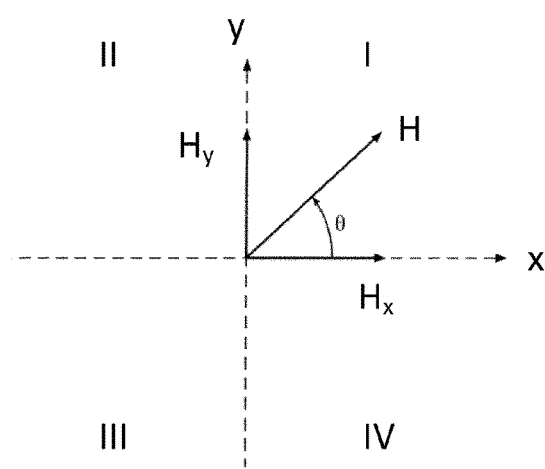
Fig. 2
Fig. 3
Fig. 4 and freely alignable at a first low temperature threshold. The magnetic element further comprises a second tunnel barrier layer and a second hard ferromagnetic layer having a magnetization

MULTI-BIT MRAM CELL AND METHOD FOR WRITING AND READING TO SUCH MRAM CELL

FIELD

The invention relates generally to a multi-bit magnetic random access memory (MRAM) cell and a method for writing and reading to such MRAM cell. The invention also relates to memory devices including multi-bit MRAM cells.

DESCRIPTION OF RELATED ART

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value Rmax corresponding to a high logic state "1". On the other hand, when the respective magnetizations are parallel, the resistance of the magnetic tunnel junction is low, namely having a resistance value Rmin corresponding to a low logic state "0". A logic state of a MRAM cell is read by comparing its resistance value to a reference resistance value Rref, which is derived from a reference cell or a group of reference cells and represents an in-between resistance value between that of the high logic state "1" and the low logic state "0".

A multibit MRAM device a storage layer having a storage magnetization direction, a sense layer having a sense magnetization direction, and a spacer layer disposed between the storage layer and the sense layer has been proposed in US2012201074 by the present applicant. During a write operation, the storage layer has a magnetization direction that is switchable between m directions to store data corresponding to one of m logic states, with m>2, and during a read operation, the sense layer has a magnetization direction that is varied, relative to the magnetization direction of the storage layer, to determine the data stored by the storage layer. The MRAM device allows for storing up to 4-bits. The read operation relies on measuring a minimum resistance of the magnetic tunnel junction by varying the direction of the sense layer magnetization.

EP2447949 discloses a multilevel magnetic element comprising a first tunnel barrier layer between a soft ferromagnetic layer having a magnetization that can be freely aligned and a first hard ferromagnetic layer having a magnetization that is fixed at a first high temperature threshold and freely alignable at a first low temperature threshold. The magnetic element further comprises a second tunnel barrier layer and a second hard ferromagnetic layer having a magnetization that is fixed at a second high temperature threshold and freely alignable at a first low temperature threshold; the soft ferromagnetic layer being comprised between the first and second tunnel barrier layers.

While a conventional MRAM device offers a number of benefits, it would be desirable to increase storage density beyond that provided by an array of single-bit cells. Specifically, it would be desirable to increase the storage density, while balancing other considerations related to power consumption and manufacturing costs.

SUMMARY

According to the invention, these aims are achieved by means of a multi-bit MRAM cell comprising a double magnetic tunnel junction including: a first magnetic storage layer, a second magnetic storage layer, a magnetic sense layer, a first spacer layer between the first magnetic storage layer and the magnetic sense layer, and a second spacer layer between the second magnetic storage layer and the sense layer; the first and second storage magnetization being switchable between m directions to store data corresponding to one of m logic states, with m>2. The present disclosure further concerns a method for a method for writing and reading to the MRAM cell and to memory devices including multi-bit MRAM cells.

BRIEF DESCRIPTION OF THE DRAWINGS

The invention will be better understood with the aid of the description of an embodiment given by way of example and illustrated by the figures, in which:

FIG. 2 shows an exploded view of the magnetic tunnel junction of the MRAM cell, according to an embodiment;

FIG. 3 shows a top view of a first and second storage layer of the magnetic tunnel junction, according to an embodiment;

FIG. 4 illustrates a first and second write magnetic fields and projected along a plane, according to an embodiment;

DETAILED DESCRIPTION OF POSSIBLE EMBODIMENTS

Figure 1:
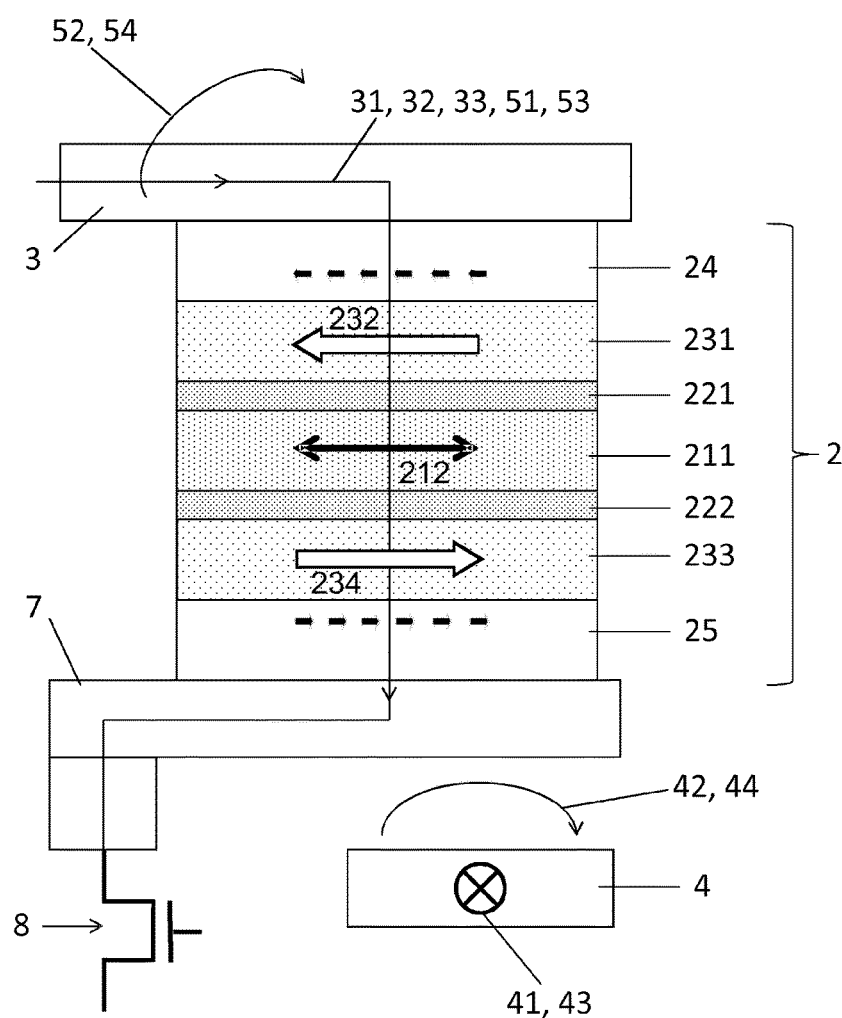
FIG. 1 shows a MRAM cell comprising a magnetic tunnel junction, according to an embodiment.

FIG. 1 shows a MRAM cell 1, according to an embodiment. The MRAM cell 1 includes a double magnetic tunnel junction 2 which comprises a first magnetic storage layer 231 having a first storage magnetization 232, a second magnetic storage layer 233 having a second storage magnetization direction 234, and a magnetic sense layer 211 having a sense magnetization 212. For the remaining of the present text, the expression "magnetic tunnel junction" is used for "double magnetic tunnel junction". The magnetic tunnel junction 2 also comprises a first spacer layer 221 that is disposed between the first magnetic storage layer 231 and the magnetic sense layer 211, and a second spacer layer 222 that is disposed between the second magnetic storage layer 233 and the sense layer 211.

The MRAM cell 1 further includes a bit line 3 that is electrically coupled to the magnetic tunnel junction 2 (on the side of the first storage layer 231) and a first field line 4 that is magnetically coupled to the magnetic tunnel junction 2 and is substantially orthogonal to the bit line 3 (which is disposed below and magnetically coupled to the magnetic tunnel junction 2 on the side of the second storage layer 233). The MRAM cell 1 also includes a selection transistor 8, which is electrically coupled, through a strap 7, to the magnetic tunnel junction 2 on the side of the second storage layer 233.

Other implementations of the MRAM cell 1 are contemplated. For example, the relative positioning of the first storage layer 231 and the second storage layer 233 can be reversed in the magnetic tunnel junction 2, with the sense layer 211 disposed above the first storage layer 231.

Each of the sense layer 211 and the first and second storage layers 231, 233 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 211 and the storage layers 231, 233 can include the same ferromagnetic material or different ferromagnetic materials. The sense layer 211 can include a soft ferromagnetic material, namely one having a relatively low coercivity, such as no greater than about 0.01 Oe, while the storage layers 231, 233 can include a hard ferromagnetic material, namely one having a relatively high coercivity, such as greater than about 0.01 Oe. In such manner, a magnetization of the sense layer 211 can be readily varied under low-intensity magnetic fields during read operations, while a magnetization of the storage layers 231, 233 remain stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 200 and the storage layer 202 can be in the nanometer ("nm") range, such as from about 1 nm to about 20 nm or from about 1 nm to about 10 nm. Other implementations of the sense layer 211 and the storage layers 231, 233 are contemplated. For example, either, or both, of the sense layer 211 and each of the storage layers 231, 233 can include multiple sub-layers in a fashion similar to that of the so-called synthetic antiferromagnetic layer.

Each of the first and second spacer layers 221, 222 functions as a tunnel barrier and includes, or is formed of, an insulating material. Suitable insulating materials include oxides, such as aluminum oxide (e.g., $Al_2O_3$) and magnesium oxide (e.g., MgO). A thickness of each of the spacer layers 221, 222 can be in the nm range, such as from about 1 nm to about 10 nm.

Referring to FIG. 1, the magnetic tunnel junction 2 also includes a first antiferromagnetic layer 24, which is disposed adjacent to the first storage layer 231 and, through exchange bias, pins the first storage magnetization direction 232 along a particular one of the m directions when a temperature within, or in the vicinity of, the first antiferromagnetic layer 24 is at a low threshold temperature $T_L$, i.e., below a blocking temperature, such as a Neel temperature, or another threshold temperature of the antiferromagnetic layer 24. The first antiferromagnetic layer 24 unpins, or frees, the first storage magnetization direction 232 when the temperature is at a first high threshold temperature $T_{H1}$, i.e., above the blocking temperature, thereby allowing the first storage magnetization direction 232 to be switched to another one of the m directions.

The magnetic tunnel junction 2 also includes a second antiferromagnetic layer 25, which is disposed adjacent to the second storage layer 233 and, through exchange bias, pins the second storage magnetization direction 234 along a particular one of the m directions when a temperature within, or in the vicinity of, the second antiferromagnetic layer 25 is at a low threshold temperature $T_L$. The second antiferromagnetic layer 25 unpins, or frees, the second storage magnetization direction 234 when the temperature is at a second high threshold temperature $T_{H2}$ that is lower than the first high threshold temperature $T_{H1}$ and higher than the low threshold temperature $T_L$, thereby allowing the second storage magnetization direction 234 to be switched to another one of the m directions. In contrast, such an antiferromagnetic layer is omitted adjacent to the sense layer 211, and, as a result, the sense layer 211 has a sense magnetization direction 212 that is unpinned and is readily varied, with the substantial absence of exchange bias.

The first and second antiferromagnetic layer 24, 25 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the second antiferromagnetic layer 25 can include, or be formed of, an alloy based on Ir and Mn (or based on Fe and Mn) having a second high threshold temperature $T_{H2}$ in the range of about 120° C. to about 220° C., or about 150° C. to about 200° C. For example, the first antiferromagnetic layer 24 can include, or be formed of, an alloy based on Pt and Mn (or based on Ni and Mn), having a first high threshold temperature $T_{H1}$ in the range of about 300° C. to about 350° C. Because the sense magnetization direction 212 is unpinned, the first and second threshold temperatures $T_{H1}$, $T_{H2}$ can be selected to accommodate a desired application, such as a high temperature application, in the absence of, or without regard to, a threshold temperature that would otherwise set an upper bound of an operating temperature window.

FIG. 2 shows an exploded view of the magnetic tunnel junction 2. The MRAM cell 1 is implemented to store data corresponding to any of three or more logic states. In other words, the MRAM cell 1 is a multi-bit cell that stores a multi-bit data value. The implementation of such a multi-bit cell enhances a storage density of the MRAM cell 1, relative to an implementation with single-bit or binary cells. In accordance with the multi-bit implementation of the MRAM cell 1, each of the first storage magnetization 232 and the second storage magnetization 234 is switchable between m directions, corresponding to $m^2$ logic states, with m>2. FIG. 3 is a top view of the first and second storage layers 231 and 233 showing the, respectively, first and second storage magnetizations 232 and 234 being switched in one of m other possible directions, represented by the dashed lines.

During the TAS-type write operation of the MRAM cell 1, the magnetic tunnel junction 2 is heated by applying a first heating current 31 through the magnetic tunnel junction 2 via the bit line 3 (see FIG. 1), with the selection transistor 8 in a saturated mode. The magnetic tunnel junction 2 is heated to the first high threshold temperature $T_{H1}$, such that a first storage magnetization 232 is unpinned and can be freely switched. Simultaneously or after a short time delay, the first field line 4 and the bit line 3 (functioning as another field line) are activated to induce a set of write magnetic fields 42, 52 to switch the first storage magnetizations 232 from an initial one of m directions to another one of the m directions, or first direction. Since the second storage magnetization 234 is also unpinned at the first high threshold temperature $T_{H1}$, the second storage magnetizations 234 is also switched to one of the m directions, in accordance with the set of write magnetic fields 42, 52.

The write operation further comprises heating the MRAM cell 1 at the second high threshold temperature $T_{H2}$ such that the first storage magnetization 232 is pinned and a second storage magnetization 234 is unpinned. Simultaneously or after a short time delay, the first field line 4 and the bit line 3 (functioning as another field line) are activated to induce a set of write magnetic fields 42, 52 to switch the second storage magnetizations 234 from an initial one of m directions to another one of the m directions, or second direction. The first storage magnetization 232 is pinned at the second high threshold temperature $T_{H2}$ and remains aligned in the first direction.

Specifically, during the write operation, a first write current 41 is applied through the first field line 4 to induce a first write magnetic field 42. A second write current 51 is applied through the bit line 3 to induce a second write magnetic field 52

The write operation of the MRAM cell 1 can be further understood with reference to FIG. 4, which illustrates the first and second write magnetic fields 42 and 52 projected along a plane (here, an x-y plane) in which the first and second storage magnetizations 232 and 234 are switchable. Specifically, Hx represents the x-component of the first write magnetic field 42 when projected along the plane, and Hy represents the y-component of the second write magnetic field 52 when projected along the plane. By combining Hx and Hy, a resultant write magnetic field, which is represented as H, is generated with an orientation at an angle θ relative to the positive x-axis, where θ=arctangent (Hy/Hx) when H lies in quadrant I, θ=180°+arctangent (Hy/Hx) when H lies in quadrant II or III, and θ=360°+arctangent (Hy/Hx) when H lies in quadrant IV. By varying the signs and magnitudes of Hx and Hy, namely by varying the directions and magnitudes of the first and second write currents 41, 51 through the bit line 3 and the first field line 4, distinct values of θ are obtained in the range of 0° to 360°. Because the first and second storage magnetization direction 232, 234 can be aligned according to θ, m logic states can be encoded, with each logic state assigned to a distinct value of θ.

FIG. 3 illustrates an example of the first storage magnetization 232 being written in a direction corresponding to a first alignment angle $θ_1$, and the second storage magnetization 234 being written in a direction corresponding to a second alignment angle $θ_2$. Here, the MRAM cell 1 can be an 8-bit cell that stores an 8-bit data value with m=16.

Figure 5A:
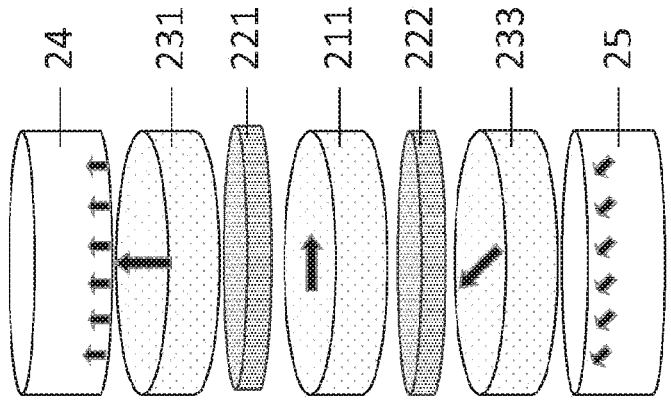
FIGS. 5 (a)-(d) and 6 illustrate a TAS-type write operation of the MRAM cell, according to an embodiment.
Figure 5B:
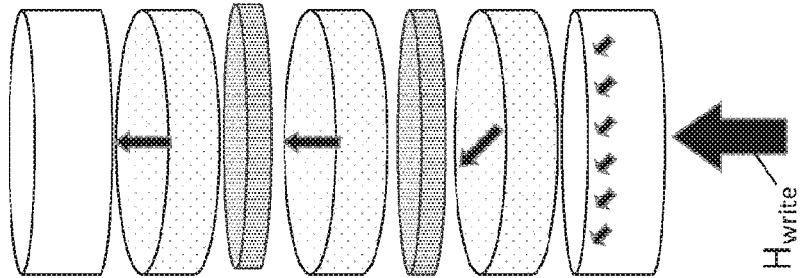
Figure 5C:
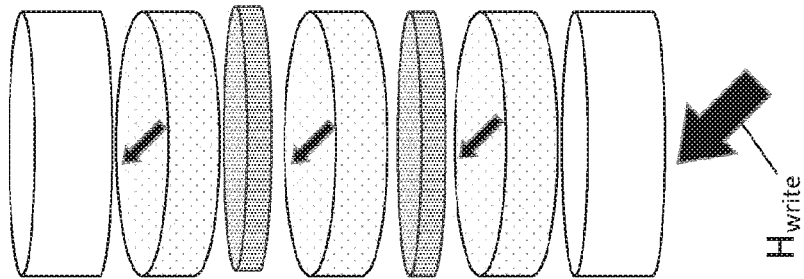
Figure 5D:
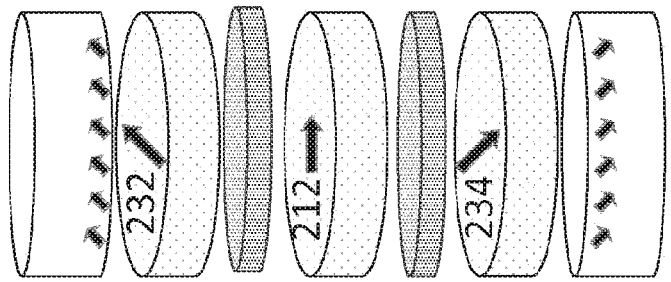
Figure 6:
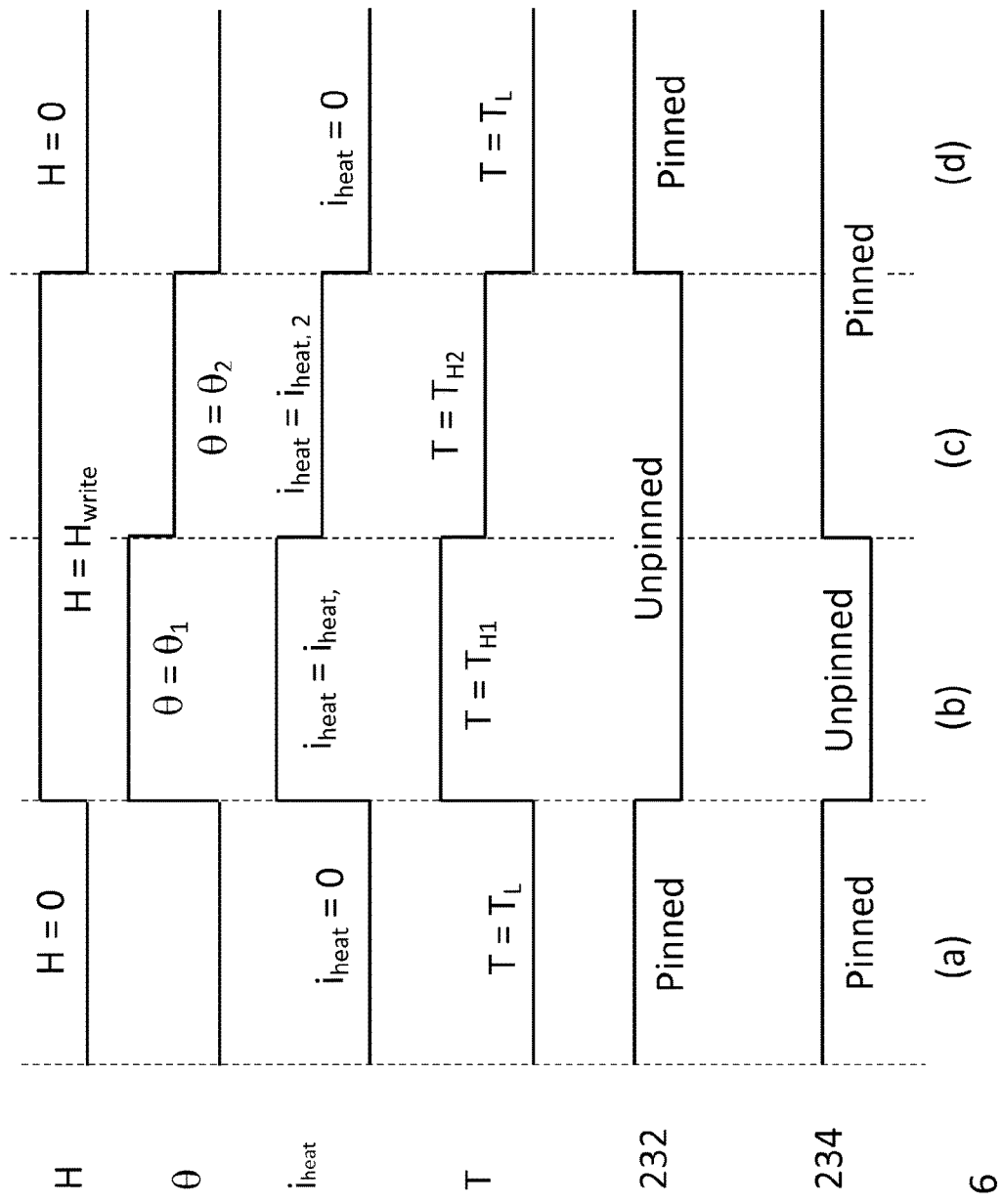

FIG. 5 illustrates the magnetic tunnel junction 2 during the TAS-type write operation according to an embodiment and FIG. 6 shows a corresponding chronogram of the write operation. In particular, FIG. 6 shows the variation, during the write operation, of the resultant write magnetic field H, the first and second alignment angles $θ_1$ and $θ_2$ of the first and second storage magnetizations 232, 234, respectively, the magnitude of the first and second heating current 31, 32 (indicated respectively by the symbols $i_{heat, 1}$ and $i_{heat, 2}$), the temperature of the magnetic tunnel junction 2 (indicated respectively by the symbol T), and the pinning conditions of the first storage magnetization 232 and second storage magnetization 234. Prior to the write operation, the first and second storage magnetization directions 232 and 234 being oriented in an initial one of m directions (FIG. 5a). No resultant write magnetic field is applied (H=0). No heating current ($i_{heat}$=0) is applied such that the magnetic tunnel junction 2 is at the low threshold temperature $T_L$ and the first and second magnetizations 232, 234 are pinned (FIG. 6a). In FIGS. 5b and 6b, the first heating current 31 ($i_{heat}=i_{heat, 1}$) is applied for heating the magnetic tunnel junction 2 at the first high threshold temperature $T_{H1}$, such that the first storage magnetization 232 is unpinned and switched to the first angle $θ_1$ with the resultant magnetic field (H=H$_{write}$). FIGS. 5c and 6c shows the step where the second heating current 32 ($i_{heat}=i_{heat,2}$) is applied for heating the magnetic tunnel junction 2 at the second high threshold temperature $T_{H2}$, such that the first storage magnetization 232 is pinned and remains unchanged and the second storage magnetization 234 is unpinned and switched to the second angle $θ_2$.

Once the second storage magnetization 234 is switched to a written direction, the selection transistor 8 is switched to a blocked mode to inhibit current flow through the magnetic tunnel junction 2, thereby cooling the magnetic tunnel junction 2 to the low threshold temperature $T_L$ (see FIGS. 5d and 6d). Either, or both, of the write magnetic fields 42 and 52 can be maintained during cooling of the magnetic tunnel junction 2, and can be deactivated once the magnetic tunnel junction 2 has cooled at the low threshold temperature $T_L$. Because the first and second storage magnetization directions 232, 234 are pinned by the exchange bias of the first and second antiferromagnetic layer 24, 25, respectively, the switched orientation of the first and second storage magnetization directions 232, 234 remains stable so as to retain the written data.

Other implementations of write operations are contemplated. For example, a write operation of the MRAM cell 1 can be carried out by applying a write current through the magnetic tunnel junction 2 via the bit line 3, using the so-called spin transfer torque ("STT") effect. In such a STT-type write operation, the write current can become spin polarized by passing through a polarizing magnetic layer (not illustrated) or through the sense layer 211, and a first and second storage magnetization 232, 234 of the first and second storage layer 231, 233, respectively, can be switched according to a spin-polarized orientation of the write current. Switching of the first and second storage magnetization 232, 234 with the spin-polarized write current also can be combined with a TAS-type write operation, such as by heating the magnetic tunnel junction 2 at the first high threshold temperature $T_{H1}$ and then applying the spin-polarized write current through the magnetic tunnel junction 2, and heating the magnetic tunnel junction 2 at the second high threshold temperature $T_{H2}$ and then applying the spin-polarized write current through the magnetic tunnel junction 2.

According to an embodiment, during a read operation of the MRAM cell 1, the bit line 3 (functioning as a field line) and the first field line 4 are activated to induce a set of read magnetic fields 44, 54 to vary a magnetization of the sense layer 211. Specifically, a first read current 43 can be applied through the first field line 4 to induce a first read magnetic field 44. A second read current 53 can also be applied through the bit line 3 to induce a second read magnetic field 54. The sense magnetization direction 212 is varied in accordance with a resultant read magnetic field corresponding to the combination of the first and second read magnetic fields 44, 54. Because the sense layer 211 is subject to little or no exchange bias, the sense magnetization direction 212 can be readily varied under low-intensity magnetic fields and at a temperature that is at the low threshold temperature $T_L$, while the first and second storage magnetization directions 232, 234 remain stable in their written direction.

According to an embodiment, the read operation of the MRAM cell 1 is carried out in multiple read cycles, in which the first and second read magnetic fields 44, 54 are induced, such that the sense magnetization direction 212 is aligned relative to the switched direction of the first and second storage magnetization 232, 234 for each read cycle. Because the sense magnetization direction 211 can be aligned according to the resultant read magnetic fields 61, the sense magnetization direction 211 can be successively switched between m directions according to each read cycle. In such manner, the sense magnetization direction is rotated to m distinct values of θ according to the read operation scheme.

As part of each read cycle, a degree of alignment between the sense magnetization direction 211 and the first and second storage magnetization directions 232, 234 is determined by applying a sense current 33 though the magnetic tunnel junction 2 via the bit line 3, with the selection transistor 8 in a saturated mode. Measuring a resulting voltage across the magnetic tunnel junction 2 when the sense current 33 is applied yields a resistance value R of the magnetic tunnel junction 2 for a particular read cycle, and for a particular alignment of the sense magnetization 211 relative to the orientations of the first and second storage magnetizations 232, 234, i.e., for a first angle $\theta_1$ and a second angle $\theta_2$ of the first and second storage magnetizations 232, 234, respectively. Alternatively, a resistance value can be determined by applying a voltage across the magnetic tunnel junction 2 and measuring a resulting current.

When the sense magnetization 212 is antiparallel to the first and second storage magnetization 231, 233, a resistance value R of the magnetic tunnel junction 2 typically corresponds to a maximum value, namely Rmax, and, when the respective magnetizations are parallel, a resistance value of the magnetic tunnel junction 2 typically corresponds to a minimum value, namely Rmin. When the respective magnetizations are between antiparallel and parallel, a resistance value of the magnetic tunnel junction 2 is typically between Rmax and Rmin.

Figure 7:
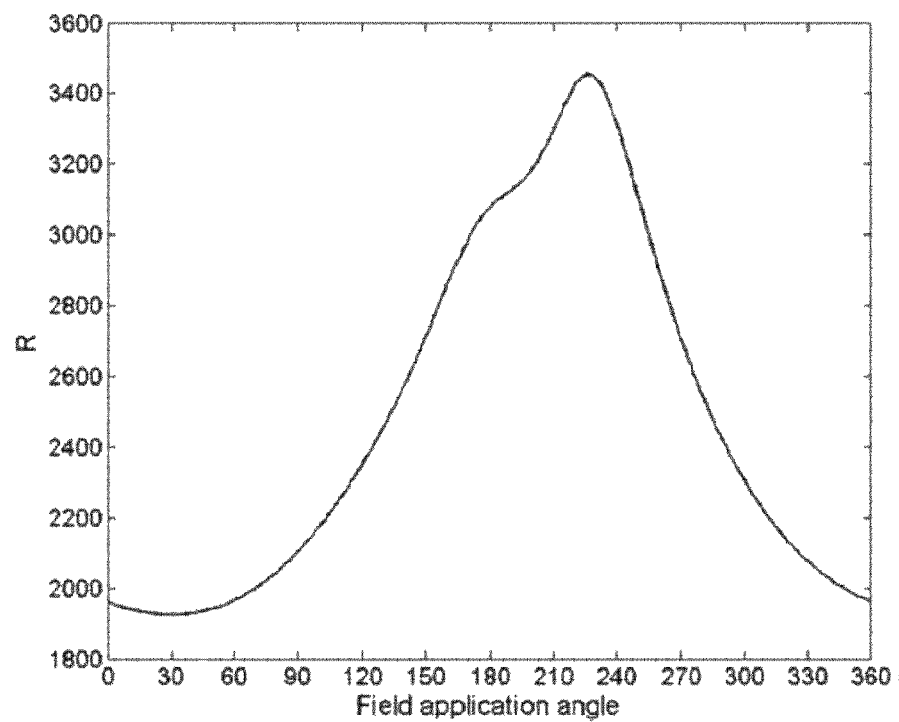
FIG. 7 shows a resistance response of the magnetic tunnel junction.

A resistance response of the magnetic tunnel junction 2 as a function of the sense magnetization direction 212 can thus be obtained from the resistance values R measured during the multiple read cycles. FIG. 7 shows an example of such a resistance response of the magnetic tunnel junction.

Figure 8:
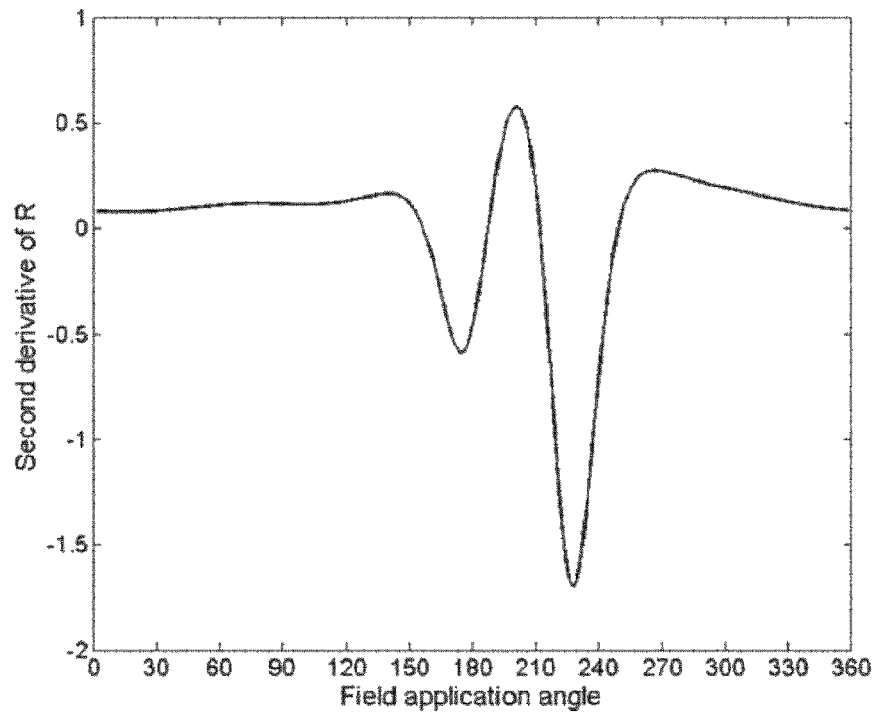
FIG. 8 shows a second local derivative of the resistance response.

The read operation further comprises a step of extracting a second local derivative of the resistance response (see FIG. 8).

The read operation further comprises a step of determining a first angle $\theta_1$ corresponding the first direction of the first storage magnetization 232, and determining a second angle $\theta_2$ corresponding the second direction of the second storage magnetization 234 from the extracted second local derivative.

In an embodiment, determining the first angle $\theta_1$ can be performed by locating a first global minimum $M_1$ of the extracted second local derivative.

Figure 9:
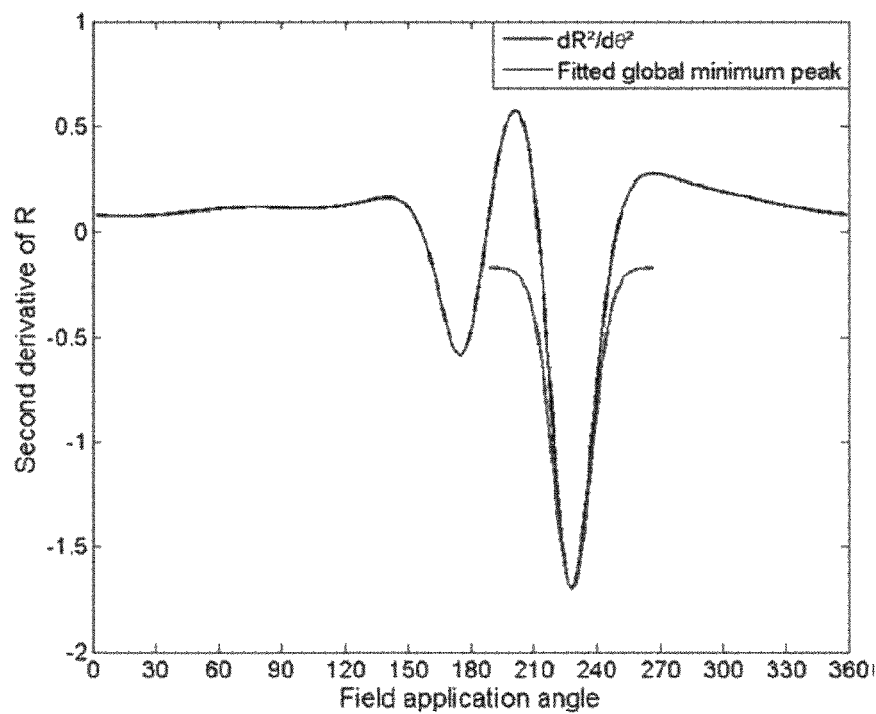
FIG. 9 shows an extracted second derivative with a fitted global minimum peak.

In another embodiment, determining the second angle $\theta_2$ can be performed by locally fitting the extracted second derivative around the located first global minimum $M_1$ to obtain a fitted global minimum peak. An example of the extracted second derivative with a fitted global minimum peak is shown in FIG. 9.

Figure 10:
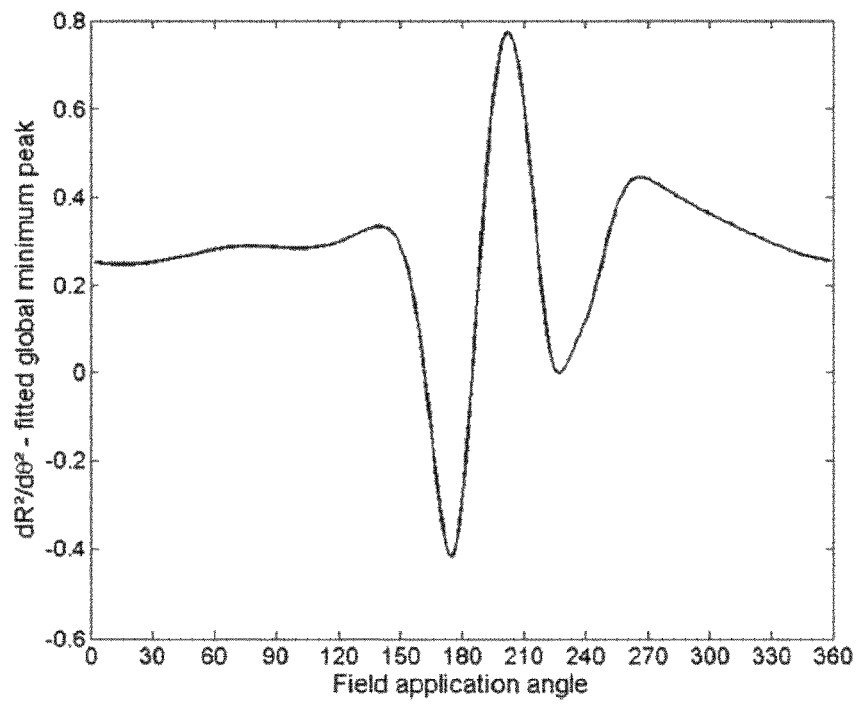
FIG. 10 shows a modified second local derivative after subtracting a portion of the fitted global minimum peak from the extracted second local derivative.

The local fitting can be performed by using a peak function, such as a Gaussian function. A portion of the fitted global minimum peak can then be subtracted around the first global minimum $M_1$ of the extracted second local derivative, such as to obtain a modified second local derivative. The second angle $\theta_2$ can be determined by locating a second global minimum $M_2$ of the modified second local derivative. FIG. 10 shows an example of a modified second local derivative after subtracting a portion of the fitted global minimum peak from the extracted second local derivative.

Preferably, the portion of the fitted global minimum peak does correspond to the full fitted global minimum peak. Indeed, in the case the first storage magnetization 232 is parallel to the second storage magnetization 234, the second angle $\theta_2$ could not be determined. Preferably, the portion comprises about 90% of the fitted global minimum peak.

In yet another embodiment, the first angle $\theta_1$ and the second angle $\theta_2$ can be stored. The read operation can further comprise the step of matching the first angle $\theta_1$ and the second angle $\theta_2$ with a lookup table such as to determine the data written in the MRAM cell 1.

Extracting a second local derivative and determining, storing and matching the first and second angles $\theta_1$, $\theta_2$ can be performed using a suitable controller in combination with, for example, a sample/hold circuit.

The read operation of the MRAM cell 1 explained above is self-referenced, since it can be carried out based on the relative alignment of magnetizations within the MRAM cell 1, without requiring a comparison to a reference cell or a group of reference cells. The self-referenced read implementation of the MRAM cell 1 is particularly desirable when reading multi-bit data, which otherwise would involve a comparison to multiple reference resistance values and would be prone to errors in view of manufacturing variability.

Other implementations of self-referenced read operations are contemplated. For example, a faster speed of reading can be achieved by skipping certain of m directions, with a resistance value corresponding to a skipped direction determined by interpolation from adjacent logic states. A faster speed of reading also can be achieved by skipping certain of $m^2$ logic states and using a suitable search technique to locate a minimum resistance value, such as by leveraging symmetries, incremental changes, or curvature related to resistance values of a subset of the m logic states.

In another embodiment not represented, the MRAM cell includes a second field line magnetically coupled to the magnetic tunnel junction 2. The second field line can be located, for example, above the bit line 3 or below the first field line 4, orthogonal to the first field line 4. During a write operation, a second write current 51 can be applied through the second field line to induce a second write magnetic field to switch a first and/or storage magnetization direction 232, 234 accordingly. During a read operation, a second read current 53 can be applied through the second field line to induce a second read magnetic field 54 to vary a sense magnetization direction 211 accordingly. The second field line can be activated in combination with the first field line 4 to induce a resultant magnetic field during writing and reading. In this configuration, the bit line 3 can be used only for passing the first and second heating currents 31, 32 and the sense current 33, separately from the second write and read currents.

A memory device implemented in accordance with an embodiment of the invention (not represented) includes a set of MRAM cells 1. Each of the MRAM cells 1 includes a magnetic tunnel junction 2 and a selection transistor 8. The MRAM cells 1 can be arranged in rows and columns along substantially orthogonal directions of a square or rectangular array, although other two-dimensional and three-dimensional arrays are contemplated. The memory device can include a set of bit lines 3 electrically connecting each MRAM cell 1 of the memory device along a row. The memory device further includes a set of first field lines 4 magnetically coupled to the magnetic tunnel junction 2 of each MRAM cell 1 along a column of the memory device. The memory device can further include a set of control lines, which are electrically coupled to the MRAM cells 1 through the selection transistor 8 along one column of the array. During write and read operations, the control lines switch the selection transistors 8 between a blocked mode (OFF) and a saturated mode (ON).

Other implementations of the field lines 4, the bit lines 3 and the control lines are also possible. For example, the field lines 4 can be combined into a common field line that is magnetically coupled to, and shared by, the MRAM cells 1 in two adjacent different columns. As another example, the first field lines 4 can be disposed above the bit lines 3, rather than below the bit lines 3. As a further example, a set of second field lines can be included above the bit lines 3, in addition to the first field lines 4.

REFERENCE NUMBERS

1 MRAM cell
2 magnetic tunnel junction
211 magnetic sense layer
212 sense magnetization
221 first spacer layer
222 second spacer layer
231 first magnetic storage layer
232 first storage magnetization
233 second magnetic storage layer
234 second storage magnetization
24 first antiferromagnetic layer
25 second antiferromagnetic layer
3 bit line
31 first heating current
32 second heating current
33 sense current
4 first field line
41 first write current
42 first write magnetic field
43 first read current
44 first read magnetic field
5 second field line
51 second write current
52 second write magnetic field
53 second read current
54 second read magnetic field
$\theta_1$ first angle
$\theta_2$ second angle
$M_1$ first global minimum
$M_2$ second global minimum
R resistance of the magnetic tunnel junction
$T_L$ low threshold temperature
$T_{H1}$ first high threshold temperature
$T_{H2}$ second high threshold temperature

What is claimed is:

1. A magnetic random access memory (MRAM) cell comprising a magnetic tunnel junction including:
    a first magnetic storage layer having a first storage magnetization direction being pinned when the magnetic tunnel junction is at a low threshold temperature and freely switchable when the magnetic tunnel junction is at a first high threshold temperature;
    a second magnetic storage layer having a second storage magnetization direction being pinned when the magnetic tunnel junction is at the low threshold temperature and freely switchable when the magnetic tunnel junction is at a second high threshold temperature lower than the first high threshold temperature and higher than the low threshold temperature;
    a magnetic sense layer having a sense magnetization that is freely switchable;
    a first spacer layer between the first magnetic storage layer and the magnetic sense layer;
    a second spacer layer between the second magnetic storage layer and the sense layer;
    the first and second storage magnetization being switchable between m directions to store data corresponding to one of $m^2$ logic states, with m>2.

2. The MRAM cell according to claim 1, wherein m=16, such that each MRAM cell can store 8-bits.

3. The MRAM cell according to claim 1;
    further including a first antiferromagnetic layer pinning the first storage magnetization at the low threshold temperature and freeing the first storage magnetization at the first high threshold temperature.

4. The MRAM cell according to claim 3;
    further including a second antiferromagnetic layer pinning the second storage magnetization at the low threshold temperature and freeing the second storage magnetization at the second high threshold temperature.

5. The MRAM cell according to claim 4;
    further comprising a bit line electrically coupled to the magnetic tunnel junction;
    wherein, during a write operation, the bit line is configured to apply a first heating current to heat the magnetic tunnel junction at the first threshold temperature and to apply a second heating current to heat the magnetic tunnel junction at the second threshold temperature.

6. The MRAM cell according to claim 5;
    wherein, during a read operation, the bit line is further configured to apply a sense current to determine a resistance of the magnetic tunnel junction.

7. The MRAM cell according to claim 1;
    further comprising a first field line that is magnetically coupled to the magnetic tunnel junction; and
    wherein, during a write operation, the first field line is configured to apply a first write current to induce a first write magnetic field, and the bit line is configured to apply a second write current to induce a second write magnetic field.

8. A method for writing to the MRAM cell according to claim 1; the method comprising:
    heating the magnetic tunnel junction to a first high threshold temperature such as to unpin the first storage magnetization;
    simultaneously or after a short time delay, switching the first storage magnetizations from an initial one of m directions to another one of the m directions;
    heating the magnetic tunnel junction at a second high threshold temperature being lower than the first high threshold temperature and higher than the low threshold temperature, such as to pin the first storage magnetization and to unpin the second storage magnetization;

simultaneously or after a short time delay, switching the second storage magnetizations from an initial one of m directions to another one of the m directions.

9. The method according to claim 8, wherein the MRAM cell further comprises a bit line electrically coupled to the magnetic tunnel junction; and wherein said heating the magnetic tunnel junction to a first and second high threshold temperature comprises applying, respectively, a first heating current and a second heating current through the magnetic tunnel junction via the bit line.

10. The method according to claim 8, wherein the MRAM cell further comprises a first field line that is magnetically coupled to the magnetic tunnel junction; and wherein said switching the first and second storage magnetizations comprises:

passing a first write current in the first field line such as to induce a first write magnetic field;

passing a second write current in the bit line such as to induce a first write magnetic field;

the first and second storage magnetizations direction being switched in accordance with a resultant write magnetic field corresponding to the combination of the first and second write magnetic fields.

11. The method according to claim 8, further comprising the step of cooling the magnetic tunnel junction to the low threshold temperature.

12. The method according to claim 11, wherein either, or both, of the write magnetic fields are maintained during cooling of the magnetic tunnel junction, and are deactivated once the magnetic tunnel junction has cooled at the low threshold temperature.

13. The method according to claim 8, wherein switching the first and second storage magnetizations is performed by passing a spin-polarized write current in the magnetic tunnel junction, via the bit line.

14. A method of reading the MRAM cell according to claim 1, wherein the MRAM cell further comprises a bit line and a first field line that are each magnetically coupled to the magnetic tunnel junction; the first field line being configured to apply a first read current to induce a first read magnetic field, and the bit line being configured to apply a second read current to induce a second read magnetic field; the method comprising:

performing a plurality of read cycles, wherein each read cycle comprises aligning the sense magnetization direction relative to the switched direction of the first and second storage magnetization, and measuring a resistance of the magnetic tunnel junction; such as to obtain a resistance response of the magnetic tunnel junction as a function of the sense magnetization direction, wherein the sense magnetization direction is varied in accordance with a resultant read magnetic field corresponding to the combination of the first and second read magnetic fields;

extracting a second local derivative of the resistance response;

from the extracted second local derivative, determining a first angle corresponding the first direction of the first storage magnetization, wherein said determining a first angle comprises locating a first global minimum of the extracted second local derivative; and determining a second angle corresponding the second direction of the second storage magnetization, wherein said determining a second angle comprises, locally fitting the extracted second derivative around the located first global minimum to obtain a fitted global minimum peak, subtracting a portion of the fitted global minimum peak around the first global minimum of the extracted second local derivative such as to obtain a modified second local derivative, and determining the second angle by locating a second global minimum of the modified second local derivative.

15. The method according to claim 14, wherein said locally fitting the extracted second derivative is performed using a peak function, such as a Gaussian function.

16. The method according to claim 14, wherein said portion comprises about 90% of the fitted global minimum peak.

17. The method according to claim 14 further comprising the steps of storing the first angle and the second angle.

18. The method according to claim 14, further comprising matching the first angle and the second angle with a lookup table such as to determine the data written in the MRAM cell.

* * * * *